(12) United States Patent
Yamaguchi et al.

(10) Patent No.: US 9,767,941 B2
(45) Date of Patent: Sep. 19, 2017

(54) SUPERCONDUCTING POWER TRANSMISSION SYSTEM AND COOLING METHOD

(71) Applicants: CHUBU UNIVERSITY EDUCATIONAL FOUNDATION, Kasugai-shi, Aichi (JP); JGC CORPORATION, Tokyo (JP)

(72) Inventors: Sataro Yamaguchi, Kasugai (JP); Hirofumi Watanabe, Kasugai (JP)

(73) Assignees: CHUBU UNIVERSITY EDUCATIONAL FOUNDATION, Aichi (JP); JGC CORPORATION, Tokyo (JP)

( * ) Notice: Subject to any disclaimer, the term of this patent is extended or adjusted under 35 U.S.C. 154(b) by 0 days.

(21) Appl. No.: 14/902,417

(22) PCT Filed: Jul. 1, 2014

(86) PCT No.: PCT/JP2014/067563
§ 371 (c)(1),
(2) Date: Dec. 31, 2015

(87) PCT Pub. No.: WO2015/002200
PCT Pub. Date: Jan. 8, 2015

(65) Prior Publication Data
US 2016/0372239 A1    Dec. 22, 2016

(30) Foreign Application Priority Data
Jul. 1, 2013    (JP) .................................. 2013-138449

(51) Int. Cl.
*H01L 39/24*    (2006.01)
*H01B 12/00*    (2006.01)
*H01B 12/14*    (2006.01)
(Continued)

(52) U.S. Cl.
CPC ............. *H01B 12/14* (2013.01); *H01B 12/16* (2013.01); *H02G 3/04* (2013.01); *H02G 15/34* (2013.01);
(Continued)

(58) Field of Classification Search
CPC ........ H01B 12/14; H01B 12/16; H02G 15/34; H02G 3/04
(Continued)

(56) References Cited

U.S. PATENT DOCUMENTS 3,657,467 A * 4/1972 Matthaus ............... H01B 12/14
174/125.1
3,686,422 A * 8/1972 Doose .................... H01B 12/16
174/15.5
(Continued)

FOREIGN PATENT DOCUMENTS

JP    10-92627 A    4/1998
JP    2002-130851 A    5/2002
(Continued)

OTHER PUBLICATIONS

Communication dated Nov. 17, 2015 from the Japanese Patent Office in counterpart application No. 2015-525240.
(Continued)

*Primary Examiner* — Sherman Ng
(74) *Attorney, Agent, or Firm* — Sughrue Mion, PLLC

(57) ABSTRACT

A superconducting power transmission system that comprises an inner pipe housing a superconducting cable therein, a radiation covering at least a part of the inner pipe from outside; and an outer pipe housing the inner pipe and the radiation shield therein. A vacuum is created in a space from an inside of the outer pipe to an outside of the inner pipe with the radiation shield therebetween. The system further comprises at least one radiation shield pipe, housed (Continued)

in the outer pipe and thermally coupled with the radiation shield, a liquefied natural gas (LNG) as a second cryogen for the radiation shield being made to flow through the radiation shield pipe.

16 Claims, 6 Drawing Sheets

(51) Int. Cl.
      *H01B 12/16*       (2006.01)
      *H02G 3/04*       (2006.01)
      *H02G 15/34*       (2006.01)
      *H01L 39/04*       (2006.01)

(52) U.S. Cl.
      CPC ............ *H01L 39/04* (2013.01); *Y02E 40/645* (2013.01); *Y02E 40/647* (2013.01)

(58) Field of Classification Search
      USPC .......................................... 174/15.5; 505/230
      See application file for complete search history.

(56) References Cited

U.S. PATENT DOCUMENTS

| | | | | |
|---|---|---|---|---|
| 3,749,811 A * | 7/1973 | Bogner | ................. | H01B 12/06 174/126.2 |
| 3,917,897 A | 11/1975 | Hildebrandt | | |
| 2006/0211579 A1 * | 9/2006 | Yamaguchi | ............ | H01B 12/14 505/230 |
| 2014/0221213 A1 | 8/2014 | Fukuda | | |

FOREIGN PATENT DOCUMENTS

| | | |
|---|---|---|
| JP | 2005-122991 A | 5/2005 |
| JP | 2006-32186 A | 2/2006 |
| JP | 2006-66383 A | 3/2006 |
| JP | 2008-177518 A | 7/2008 |
| JP | 2009-9908 A | 1/2009 |
| WO | 2013/084528 A1 | 6/2013 |

OTHER PUBLICATIONS

Sataro Yamaguchi, Hirofumi Watanabe, "Special Feature: Freezing and Cold Heat Technologies as to a thermal insulation double pipe and a low temperature system for a superconduction cable," Superconductivity Web21, International Superconductivity Technology Center, [online], Jun. 3, 2013,( 3 pages total).

Saul D. Miller et al., eds. "Cryocooler Performance Estimator," Cryocoolers 14, A publication of the International Cryocooler Conference. (2007) 9 pages total.

Yoshimichi Aiyana (the head of the chapter), Handbook of Superconductivity and Cryogenic Engineering, Association of Cryogenic Engineering, Ohmsha, (1993), Chapter 7, (6 pages total).

Agency for Natural Resources and Energy of Ministry of Economy, Trade and Industry, "As to results of study of amount of standard heat generation, and revised values thereof, which are effective in or after FY2005", May 2007, Internet URL:http://www.enecho.meti.go.ip/info/statistics/jukyu/resource/pdf/070601.pdf searched on Jun. 7, 2013. (29 pages total).

* cited by examiner

SUPERCONDUCTING POWER TRANSMISSION SYSTEM AND COOLING METHOD

FIELD

CROSS-REFERENCE TO RELATED APPLICATIONS

This invention claims priority to Japanese patent application No. 2013-138449 filed on Jul. 1, 2013, the entire contents of which are incorporated herein by reference thereto. The present invention relates to a superconducting electric power transmission system and a cooling method.

BACKGROUND

An example of a thermally insulated double pipe used in a superconducting electric power transmission is illustrated in FIG. 1. FIG. 1 is a picture of a thermally insulated double pipe used in an experimental facility of the applicant of the present application. Regarding a thermally insulated double pipe, reference may be made to patent literature 1 or the like.

According to FIG. 1, an outer pipe 4 which is made of a zinc-galvanized steel pipe, holds a vacuum and has a diameter of 200A (204.7 mm). An inner pipe 2 with a support structure (not illustrated) is provided inside the outer pipe 4. The inner pipe 2 is a stainless pipe and has a diameter of 50A (60.5 mm). A superconducting cable 1 is provided inside the inner pipe 2. Liquid nitrogen is made to flow through a space between the inner pipe 2 and the superconducting cable 1. A space between the outer pipe 4 and the inner pipe 2 is kept airtight in a vacuum under vacuum insulation. In order to cope with heat intrusion through radiation, a multilayer thermal insulation film (MLI) 3 is provided on an outer surface of the inner pipe 2. The multilayer thermal insulation film (MLI) 3 is, for example, formed of a multilayer of plastic films on each of which aluminum is deposited. Even with this structure, there is still observed heat intrusion with an amount of about 1 W to 2 W per unit length (1 m).

CITATION LIST

Patent Literature

[PATENT LITERATURE 1] JP Patent Kokai JP-A-2006-32186 (JP Patent JP 4689984 B)

Non Patent Literature

[NON PATENT LITERATURE 1] Yoshimichi Aiyana (the head of the chapter), Handbook of Superconductivity and Cryogenic Engineering, Association of Cryogenic Engineering, Ohmsha, (1993), Chapter 7, p. 944
[NON PATENT LITERATURE 2] P. Kittel, Cryocooler 14, p. 563 (2007)
[NON PATENT LITERATURE 3] Agency for Natural Resources and Energy of Ministry of Economy, Trade and Industry, "As to results of study of amount of standard heat generation, and revised values thereof, which are effective in or after FY2005", May 2007, Internet <URL: http://www.enecho.meti.go.jp/info/statistics/jukyu/resource/pdf/070 601.pdf> searched on Jun. 7, 2013.

SUMMARY

The following describes analysis of the related technique illustrated in FIG. 1.

COP (Coefficient of Performance) of a refrigerating machine at a liquid nitrogen temperature is about 0.1. COP of a refrigerating machine represents a cooling capability per 1 kW power consumption (COP=cooling capability/power consumed by a refrigerating machine).

When heat of 1 W to 2 W per unit length (1 m) (unit of an amount of heat intrusion per 1 m of pipe length) is to be removed by a refrigerating machine of COP=0.1, the power consumed by the refrigerating machine is multiplied by ten times because COP is 0.1 and the refrigerating machine consumes power of 10 W to 20 W per unit length (1 m). This value, although loss is less than in a copper cable, is desirably further reduced to save money.

A large amount of heat intrusion needs a large amount of circulation of a coolant such as liquid nitrogen. Pump power is proportional to the square of a flow amount and thus it is a technological target to reduce heat intrusion as much as possible. This heat intrusion is a typical problem of apparatuses, such as a superconducting apparatus, which need to be kept at a low temperature. It is to be noted that the term "superconductivity" is synonym with "super electric conduction".

Particularly in an equipment cooled not at a nitrogen temperature around 77K (Kelvin; a unit to represent an absolute temperature) but at a temperature of about 4K in which liquid helium is used, COP of a refrigerating machine is rapidly decreased. In an experimental equipment, such as an accelerator with a long beam line, reducing heat intrusion is a significantly important issue. Accordingly, in an experimental equipment (see FIG. 2) called LHC (Large Hadron Collider) of CERN which conducts research of elementary particles and accelerators in Europe, a radiation shield is used. There are provided a pipe (referred to as "pipe 1") with a cap (see the arrow in FIG. 2) close to the inner surface of an outer pipe which keeps a vacuum, to which a structure (referred to as "radiation shield") covering the whole pipe therein is thermally strongly coupled. Helium gas of 55K is made to flow through the pipe 1 to prevent heat intrusion by radiation into an inside apparatus of a lower temperature (about 4K). Actually, a 55K shield undergoes heat intrusion in an amount of 1.8 W per unit length (1 m), and regarding an amount of heat intrusion into a 4K system, heat intrusion by radiation into an inside apparatus of the lower temperature (about 4K) is prevented by making helium gas of 55K flow through "pipe 1" in FIG. 2. Actually, the 55K shield undergoes heat intrusion in an amount of 1.8 W per unit length (1 m), and an amount of heat intrusion into the 4K system is 0.05 W per unit length (1 m). The reason that the amount of heat intrusion into an inner pipe 2 is reduced in this way, resides in that radiation power is proportional to the fourth power of the absolute temperature ("Stefan-Boltzmann law").

LHC is provided with a plurality of refrigerating machines. COP of a refrigerating machine of 55K is 16 times as large as COP of 4K refrigerating machine (which is approximately equal to Carnot Efficiency Ratio) (see Non-Patent Literature 2).

Using such a radiation shield makes it possible to reduce power consumption to one sixteenth. This is important for large-scale accelerators such as LHC. Radiation shields are used widely in accelerators or the like, as a system for reducing the amount of heat intrusion into the apparatus operating at a liquid helium temperature.

Use of a radiation shield is an issue to be considered also in a power transmission system using a high-temperature superconductor. So, as to a thermally insulated double pipe illustrated in FIG. 3, the inventor have conducted numerical analysis. Assume that in FIG. 3 the diameter of an outer pipe 14 is 250A (A represents an external size (a size of the outer diameter) of a pipe), the temperature is 300K, the diameter of a radiation shield 13 is 150A, and the diameter of an inner pipe 12 is 100A. In FIG. 3, the radiation shield 13 outside the inner pipe 12 is not a pipe but is structured with a combination of e.g. a plurality of annular members (aluminum extrusion members). A multilayer thermal insulation film (MLI) is wound around the shield. In FIG. 3, a supporting structure connected to the inner pipe 12 and the radiation shield 13 or the like is not illustrated for the sake of simplicity of the drawing.

The temperature of the inner pipe 12 is fixed at 77K. The inner pipe 12 houses a superconducting cable (super-electroconduction cable) 11 using a high-temperature superconductor. A whole space from the inner surface of the outer pipe 14 to the outer surface of the inner pipe 12, with the radiation shield 13 placed therebetween is subjected to a vacuum. Thus, regarding heat transportation between these, it suffices that only radiation is taken into consideration. The radiation shield 13 and the inner pipe 12 are each wound with a multilayer thermal insulation film (MLI) to reduce heat intrusion by radiation. For radiation ratios necessary for the calculation, catalog values of MLI are used. Structural heat transportation (conductive heat) from the supporting structure for the radiation shield 13 and the inner pipe 12 is disregarded.

FIG. 4 shows computation results of an amount of heat intrusion into the radiation shield from room temperature and an amount of heat intrusion into the inner pipe from the radiation shield, with a temperature of the radiation shield used as a parameter. As the temperature of the inner pipe 12, both 77K and 20K were used. In FIG. 4, a horizontal axis is Shield temperature and a vertical axis is heat intrusion amount (Heat leak). In a case where the temperature of the radiation shield 13 (Shield pipe) is 77K (Shield Inner (77K)), it is identical to the temperature of the inner pipe 12 of 77K, and thus an amount of heat intrusion into the inner pipe 12 is zero, resulting in that an amount of heat intrusion into the radiation shield 13 per unit length (1 m) is ca. 0.5 W. On the other hand, no large difference between the inner pipe 12 of 77K and the inner pipe 12 of 20K is caused. This is because the radiation is proportional to the fourth power of an absolute temperature.

An increase in the temperature of the radiation shield causes a gradual increase in an amount of heat intrusion into the inner pipe 2 in FIG. 1. However, at the temperature of about 180K, the amount of heat intrusion is ca. 0.05 W per unit length (1 m). In comparison to this value, an amount of heat intrusion into the radiation shield is especially large.

These calculated values show good agreement with the experimental values of LHC@CERN. That is, in a well-designed thermally insulated double pipe, heat transportation is caused predominantly by radiation, and heat transportation by heat conduction from a supporting structure is not so large (i.e. relatively small).

The reason is as follows: as mentioned above, radiation is proportional to the fourth power of an absolute temperature and thermal conductivity of materials is temperature-dependent. In general, insulators such as epoxy resin or the like are used as a material for making a supporting structure, thermal conductivity of each of those materials is proportional to an absolute temperature to the power of −2.5 to −3. Therefore, thermal conductivity at a low temperature which is a radiation shield temperature is extremely small in comparison to that at a normal temperature.

FIG. 4 further shows computation results in a case where the temperature of the inner pipe 12 of FIG. 3 is at 20K. The computation results are almost identical to those in a case of 77K. The same reason as mentioned above applies to this case. This evaluation was done in order to study a case where $MgB_2$ (magnesium diboride) is used as superconducting material. This case will be described later on.

It is conceived that study that a thermally insulated double pipe housing therein a superconductive cable can significantly enhance its thermal insulation performance, with a use of a thermally insulated double pipe with a radiation shield as used in an accelerator.

FIG. 5 illustrates a structure of a thermally insulated double pipe to which the present invention as described later on is applied.

Referring to FIG. 5, the double pipe is so structured that in order to keep a radiation shield 13 at a constant temperature, a radiation shield pipe 15 is connected to the radiation shield 13 (thermally connected) to make a cryogen 2 flow through the radiation shield pipe 15. Those elements including an inner pipe 12 are kept in a vacuum.

Issues to be considered in relation to the cryogen 2 are a refrigerating machine for the cryogen 2, a temperature thereof, and what material is to be used as the cryogen 2.

A 77K refrigerating machine and a 123K refrigerating machine are different from each other in COP by a factor of about 2 at most. Thus, power consumption of a refrigerating machine to eliminate heat intrusion is reduced nearly to half. In contrast, the temperature of the cryogen 2 of 180K results in a difference in COP by a factor of greater than 4.3.

A thermally insulated double pipe having the radiation shield 13 as illustrated in FIG. 3 and FIG. 5 is expensive in comparison to that which does not have the radiation shield 13.

As a result, there is a concern as to whether the decrease by half in power consumption of a refrigerating machine can sufficiently compensate for an increase in cost.

Further, provision of two types of individual refrigerating machines could increase costs for maintenance or the like, with the whole system taken into consideration.

Due to the Great East Japan Earthquake on Mar. 11, 2011 and the resulting accident of the First Nuclear Power Plant of Fukushima, imports of liquefied natural gas (LNG) for power supply have greatly increased. LNG is composed mainly of methane and includes other components which slightly vary depending on its production area. The LNG temperature is a temperature around a boiling point of methane under a pressure of one atmosphere which amounts to about −160 degrees Celsius (=113K). This gas is used as fuel for highly efficient combined thermal power plants using a gas turbine and steam turbine (the efficiency of which is said to be more than 55% which value is significantly high in comparison to about 40% of the efficiency of conventional thermal power plants). Accordingly, along with a shale gas revolution in the United States, import of LNG will increase more and more. However, the production of LNG needs a huge amount of electric power.

The reason is that a refrigerating machine is used to liquefy natural gas obtained from the underground (earth), the gas being of a temperature higher than a normal temperature. In this case, a refrigerating machine needs to absorb heat with an amount of 890 kJ/kg (Non-Patent Literature 1).

A refrigerating machine is operated by electric power and thus needs a power plant in a production region. Assumption has been made that generator efficiency and overall efficiency of a motor, a compressor, a heat exchanger and so forth used in a refrigerating machine are 40%, and % Carnot efficiency of the refrigerating machine is 30% (Non-Patent Literature 2). Carnot efficiency $\varepsilon_c$ for low temperature $T_c$ and high temperature $T_h$ is given as the following equation.

$$\varepsilon_c = \frac{T_c}{T_h - T_c} \qquad (1)$$

In this case, the Carnot efficiency is about 19%, which results in energy consumption of 11.7 MJ/kg for natural gas liquefaction in the production region of LNG. The total amount of heat generation of natural gas which is imported into Japan is said to be, for example, about 54.6 MJ/kg (Non-Patent Literature 3).

Accordingly, 21.4% of the amount of the heat generation is consumed when LNG is produced. This means that the increase in efficiency of a combined power plant using a gas turbine and a steam turbine results in an increase in loss in the whole system due to use of LNG.

Use of LNG cold energy of low temperature is very important in a global view and has been studied variously. However, it is also said that 90% or more of cold energy of LNG imported is not used.

FIG. 8 illustrates a vaporizer (a heat exchanger) of a related technique. A tank 21 storing LNG 20 is usually controlled at a pressure of about one atmosphere. The temperature of LNG 20 is around 113K (−160 degrees Celsius). LNG 20 is pumped out with a pump 22 and introduced into a heat exchanger 23. A pump 24 is used to introduce seawater into the heat exchanger 23 from sea, and LNG obtains heat to be gasified. This gas (natural gas) is transported to consumers via pipes. The system so configured is a LNG base.

As illustrated in FIG. 8, a cold energy that LNG possesses is discarded into the environment. Instead of cold energy, a concept "exergy" obtained by multiplication of heat amount by Carnot efficiency is often used worldwide.

When a temperature of seawater is low, such a process is occasionally conducted that seawater is heated with a boiler before it is introduced into a heat exchanger. However, this is greatly wasteful in terms of energy. Therefore, it is desired to develop a novel method for utilization.

Hence, the present invention has been made in light of the above issues, and an object of the present invention is to provide a superconducting power transmission system and a cooling method which achieve improvement in thermal insulation performance. Further, it is another object of the present invention to provide a superconducting power transmission system and a cooling method which are capable of effectively using cold energy that LNG possesses.

According to the present invention, there is provided a superconducting power transmission system comprise: a first pipe housing a superconducting cable therein, a radiation shield covering at least a part of the first pipe from outside; and a second pipe housing the first pipe and the radiation shield therein, with a vacuum being created in a space from an inside of the second pipe to an outside of the first pipe with the radiation shield placed therebetween, wherein the system further comprises at least one radiation shield pipe housed in the second pipe and thermally coupled with the radiation shield, a liquefied natural gas (LNG) as a second cryogen for the radiation shield being made to flow through the radiation shield pipe.

According to the present invention, the system may have an arrangement in which as the second cryogen, a cryogen heat-exchanged with liquefied natural gas (LNG) is made to flow through the radiation shield pipe.

According to the present invention, there is provided a method of cooling a superconducting power transmission system that comprises: a first pipe housing a superconducting cable therein; a radiation shield covering at least a part of the first pipe from outside; and a second pipe housing the first pipe and the radiation shield therein, with a vacuum being created in a space from an inside of the second pipe to an outside of the first pipe with the radiation shield placed therebetween, wherein the method comprises:

arranging at least one radiation shield pipe thermally coupled with the radiation shield within the second pipe; and causing a liquefied natural gas (LNG) as a second cryogen for the radiation shield to flow through the radiation shield pipe.

According to the present invention, the method may comprise causing a cryogen heat-exchanged with liquefied natural gas (LNG), as the second cryogen to flow through the radiation shield pipe.

According to the present invention, thermal insulation performance is improved and cold energy that LNG, for example, possesses can be effectively used.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

DETAILED DESCRIPTION

Figure 5:
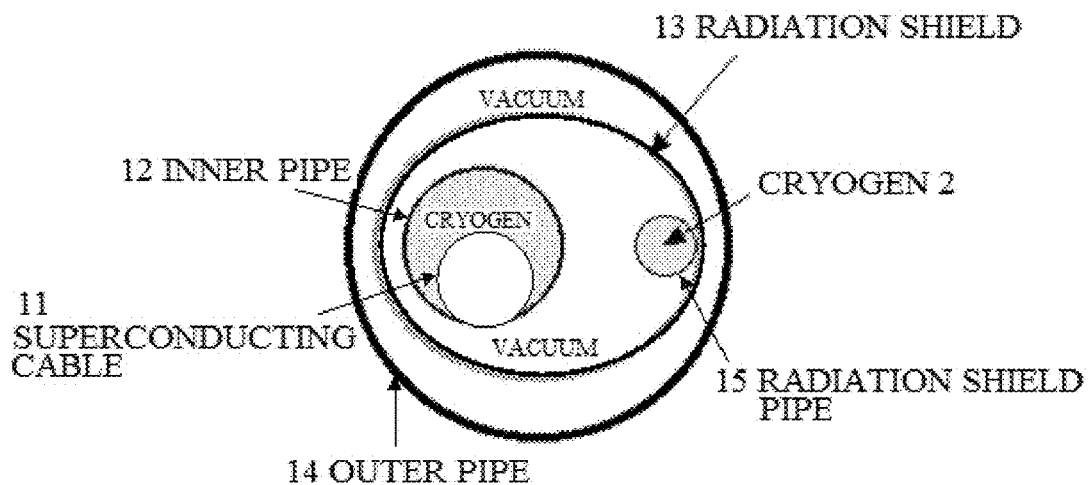
FIG. 5 is a diagram schematically illustrating a thermally insulated double pipe for superconducting power transmission to which the present invention is applied.

According to the present invention, referring to FIG. 5, a thermally insulated double pipe includes a first pipe 12 (an inner pipe) within which a superconducting cable 11 is housed, a radiation shield 13 that covers at least a part of the first pipe 12 (e.g. a part or a whole thereof in its longitudinal direction) from outside (the radiation shield 13 is composed of, for example, a combination of a plurality of plates), and a second pipe 14 (an outer pipe) within which the first pipe 12 and the radiation shield 13 are housed. In operation, a space from an inside of the second pipe (14) to an outside of the first pipe (12) with the radiation shield (13) placed therebetween is held in a vacuum. According to the present invention, the double pipe comprises at least one radiation shield pipe (15) that is housed in the second pipe (14) and arranged in association with the radiation shield (13). As a second cryogen (a cryogen 2) for cooling the radiation shield (13), liquefied (or liquid) natural gas (LNG), for example, is made to flow through the radiation shield pipe 15. Alternatively, the thermally insulated double pipe may be configured such that as the second cryogen of the radiation shield (13), a cryogen heat-exchanged with liquefied natural gas (LNG) is made to flow through the radiation shield pipe 15. It is to be noted that a cryogen for the superconducting cable 11 (a first cryogen) is made to flow through the inner pipe 12.

Figure 6:
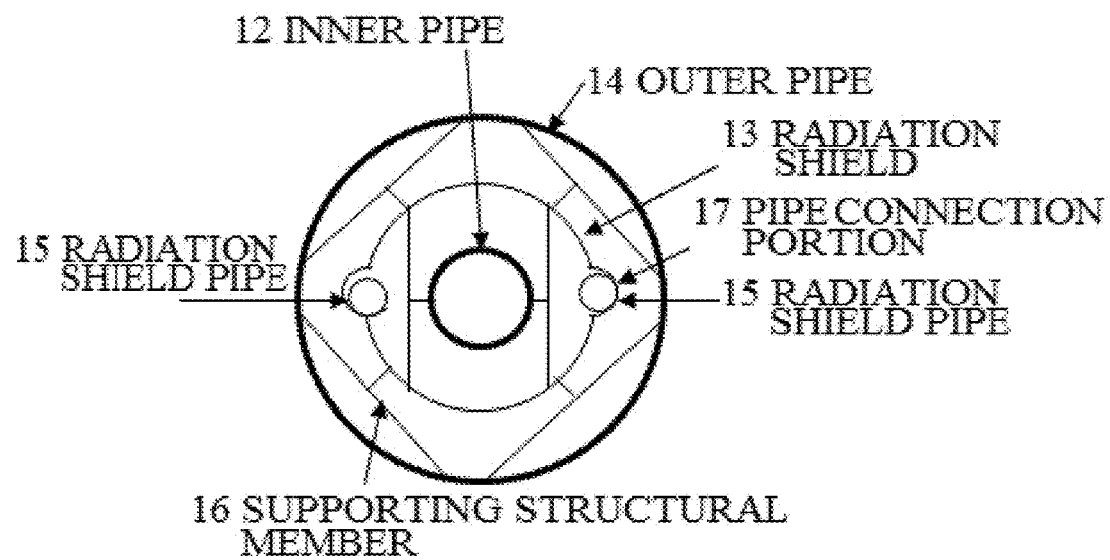
FIG. 6 is a diagram schematically illustrating a thermally insulated double pipe for superconducting power transmission to which the present invention is applied.
Figure 7:
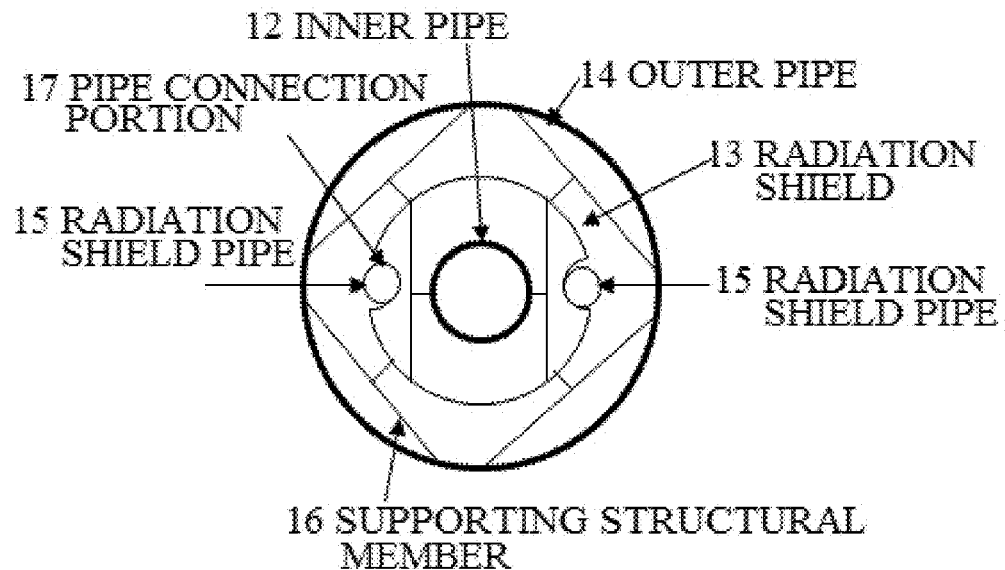
FIG. 7 is a diagram schematically illustrating a thermally insulated double pipe for superconducting power transmission to which the present invention is applied.
Figure 8:
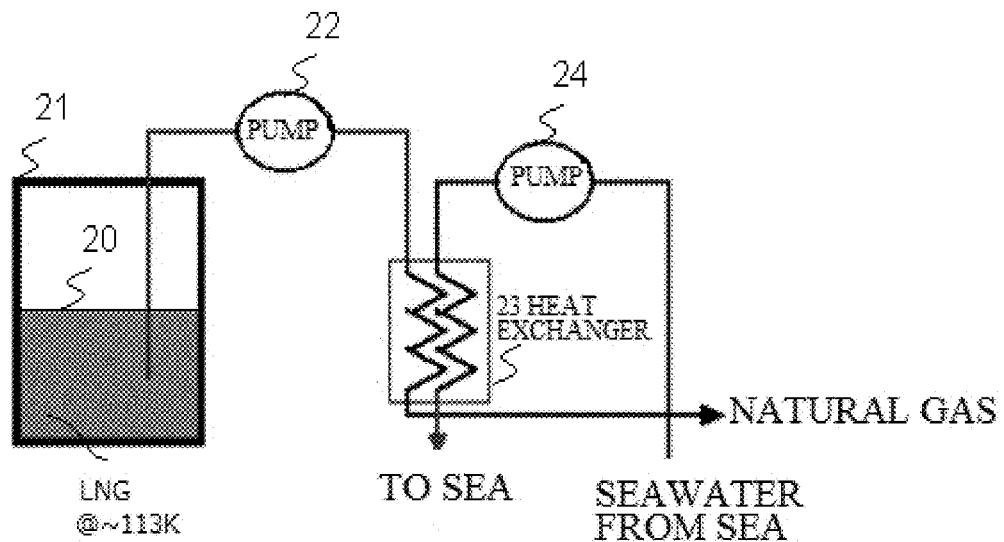
FIG. 8 is a diagram schematically illustrating a process of producing natural gas from LNG.

Although not limited thereto, as an example of modes of thermal coupling between a radiation shield pipe 15 and a radiation shield 13, the radiation shield 13 may have on its inner side a pipe connection portion 17 (a supporting part) which a part of an outer periphery of the radiation shield pipe 15 connects to (fits into), as schematically illustrated in FIG. 6. So, it is expected that the cryogen flowing through the radiation shield pipe 15 and the radiation shield 13 reach the same temperature. The radiation shield 13 and the radiation shield pipe 15 are thermally well coupled. Regarding the radiation shield 13, a material having a good thermal conductivity is used as a member for the radiation shield 13, for example, an aluminum material is used. In order to decrease thermal resistance of the radiation shield 13, also a thickness of the radiation shield 13 (the thickness in a direction perpendicular to a sheet plane) is set to a predetermined value. The radiation shield 13 may be contrived to increase its mechanical strength. A structure (supporting structural member) to support the inner pipe 12 or the like can be installed in the radiation shield 13. Further, at the pipe connection portion 17, the radiation shield pipe 15 may be fixed to the radiation shield 13 with a fixing member (not illustrated). Alternatively, as schematically illustrated in FIG. 7, the radiation shield 13 may have on its outer periphery side a pipe connection portion 17 (a supporting portion) which a part of the radiation shield pipe 15 connects to (fits in). A supporting structural member 16 to support the inner pipe 12 and the radiation shield 13 are schematically illustrated in FIG. 6 and FIG. 7. The supporting structural member 16 is mechanically contacted to parts which are different from each other in temperature. Accordingly, a material of a low thermal conductivity is used for the supporting structural member 16 in order to cope with heat intrusion caused by heat conduction via the contact. Likewise, it is necessary to provide a supporting structural member which mechanically supports the inner pipe 12 from the radiation shield 13. In FIG. 6 and FIG. 7, a superconducting cable 11, a cryogen 1 (a first cryogen) and a cryogen 2 (a second cryogen) are not illustrated. In FIG. 6 and FIG. 7, two radiation shield pipes 15 are oppositely arranged across the radiation shield 13. However, the radiation shield pipes 15 is not limited to these arrangement and the other arrangement in which only one radiation shield pipe 15 may be used, as illustrated in FIG. 5, may be adopted as a matter of course, because this one pipe can be used as a return pipe for a cryogen 2. Further, if a return pipe for a cryogen flowing through the inner pipe 12 which houses the superconducting cable 11 is needed, a radiation shield pipe 15 is provided on the inside of the radiation shield 13. Though not limited thereto, such an arrangement in which four radiation shield pipes 15 in total are provided inside the outer pipe 14 may be adopted. As described above, connection forms between the radiation shield pipe 15 and the radiation shield 13 are not limited to examples illustrated in FIG. 5 to FIG. 7, and any types of connection forms which allow efficient thermal connection between the radiation shield pipe 15 and the radiation shield 13 may be used. Inside the radiation shield 13 in FIG. 6, the radiation shield pipe 15 may be fixed to the radiation shield 13 by means of a fixing member (not illustrated). The radiation shield 13 is made of, for example, an aluminum extrusion member. In FIG. 6, a cross-section of the radiation shield 13 is schematically illustrated using a line, but an actual radiation shield 13 has a given width between the outer periphery and the inner periphery thereof. Of course, the pipe connection portion 17 may be so formed that the member is accommodated at the inner peripheral side of the radiation shield 13 and does not protrude from the outer periphery side of the radiation shield 13. Likewise, in FIG. 7, a cross-section of the radiation shield 13 is schematically illustrated using a line, but the radiation shield 13 actually has a width. Of course, the pipe connection portion 17 may be so formed that the member is accommodated at the outer periphery side of the radiation shield 13 and does not protrude from the inner peripheral side of the radiation shield 13.

According to the present invention, LNG cold energy is used for cooling a radiation shield of a superconducting power transmission system, as mentioned in relation to the above exemplary embodiment.

Figure 9:
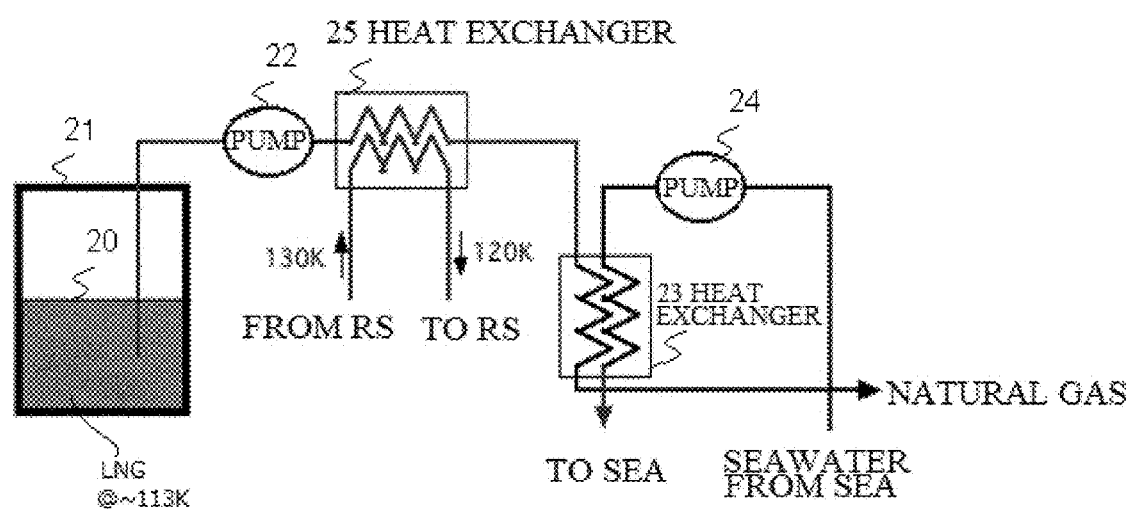
FIG. 9 is a diagram schematically illustrating an exemplary embodiment.

In light of the issues of a superconducting cable and utilization of LNG cold energy, a system as illustrated in FIG. 9 is proposed for a cryogen (a cryogen 2) used to keep a temperature of a radiation shield constant.

Before LNG is heat-exchanged with seawater and gasified, a cryogen 2 for keeping a temperature of a radiation shield (the radiation shield 13 in FIGS. 5, 6 and 7) constant is heat-exchanged with LNG in a heat exchanger 25 and cooled. In the system illustrated in FIG. 9, a temperature of the cryogen 2 (cryogen 2 in FIG. 5: cryogen 2 from the radiation shield (RS)) before entering the heat exchanger 25 is at 130K, and the temperature of the cryogen 2 after being cooled in the heat exchanger 25 is at 120K. The cooled cryogen 2 is made to flow into the radiation shield pipe 15 which is thermally connected to the radiation shield 13 as illustrated in FIG. 5. As a result, a refrigerating machine to keep the radiation shield 13 at a constant temperature is not needed, and merely a heat-exchanger and circulation power for the cryogen 2 are needed. That is, electric power consumed to keep the radiation shield 13 in FIG. 5 at a constant temperature is in most cases no longer required.

Figure 1:
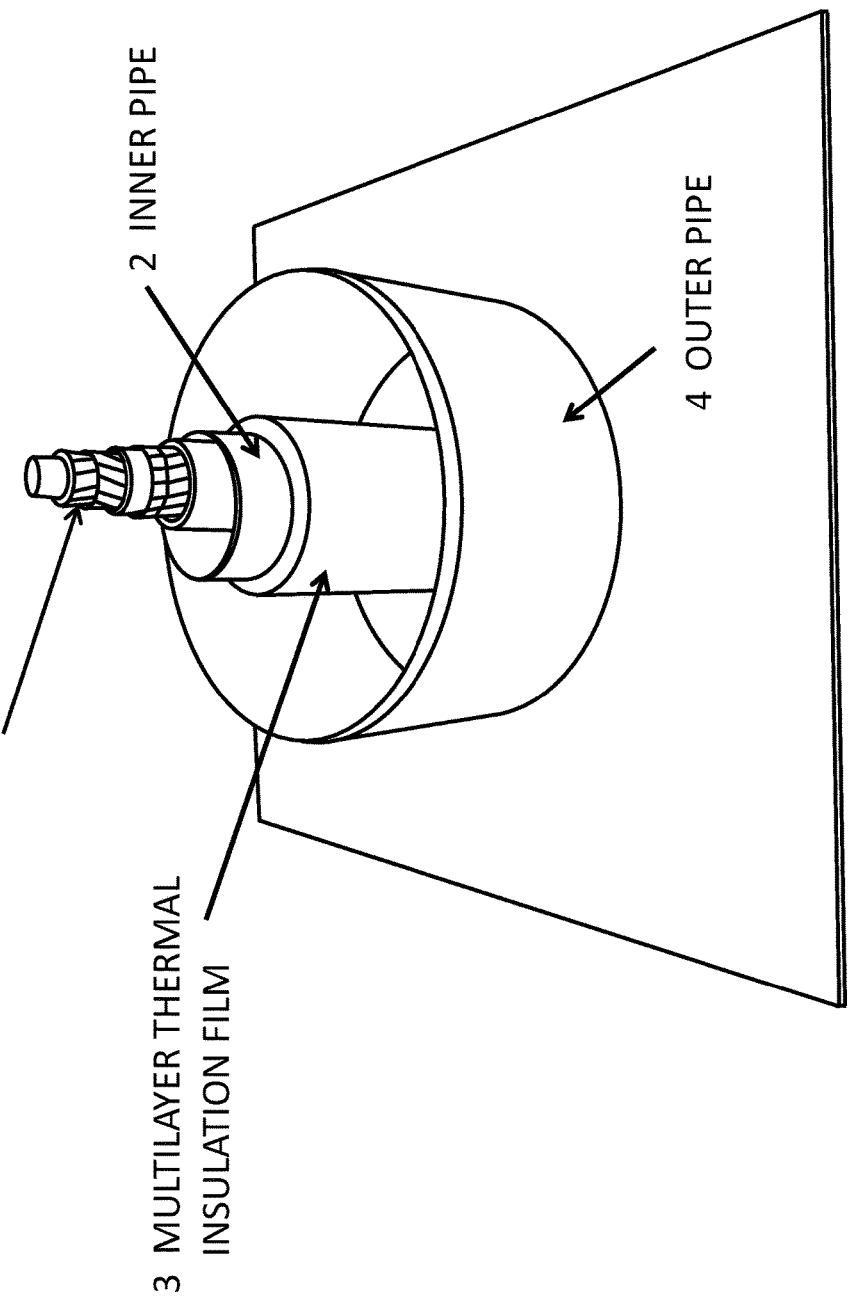
FIG. 1 is a diagram illustrating a superconducting cable and a thermally insulated double pipe.
Figure 2:
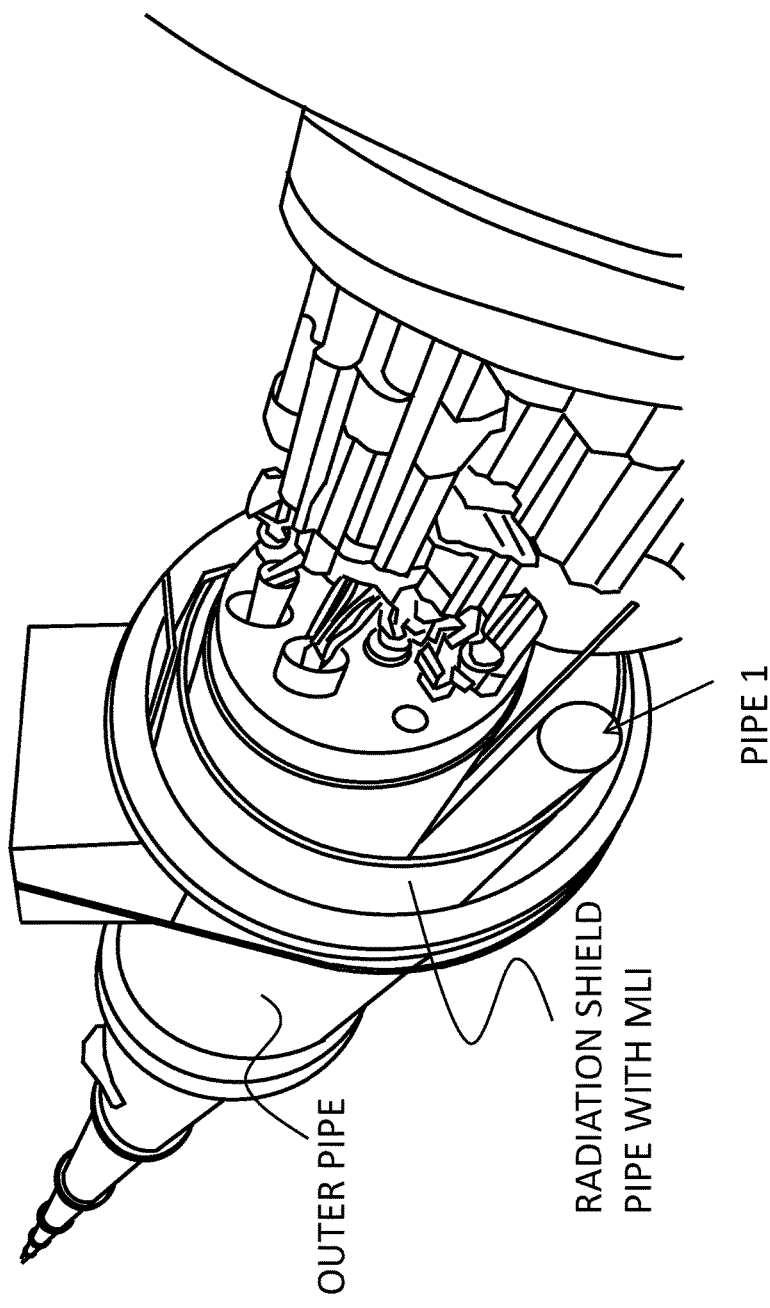
FIG. 2 is a diagram illustrating a thermal insulation pipe of LHC of CERN.
Figure 3:
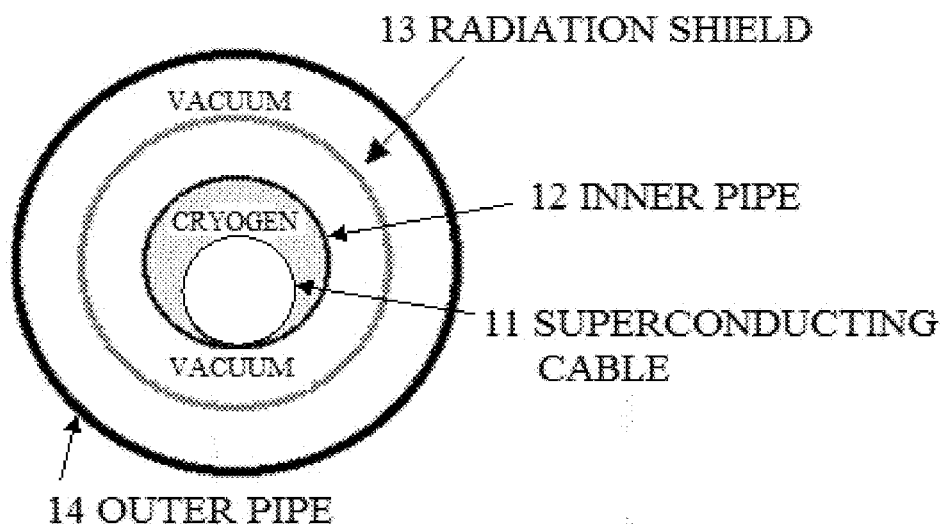
FIG. 3 is a diagram schematically illustrating a thermally insulated double pipe.
Figure 4:
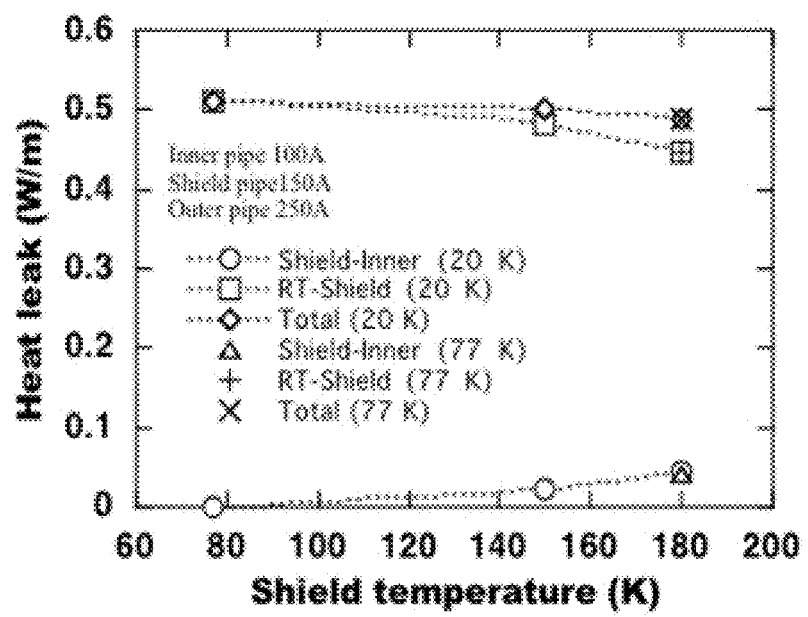
FIG. 4 is a diagram illustrating a relation between heat intrusion into a radiation shield and an inner pipe and temperatures of the radiation shield.

In the calculation example illustrated in FIG. 4, assuming that the radiation shield temperature is 120K to 130K, the performance of a refrigerating machine for maintaining the superconducting cable is decreased to about one-twentieth because an amount of heat intrusion into 77K-system is about 5% of an amount of heat intrusion into the radiation shield. Therefore, the power consumption of the refrigerating machine is reduced to one-twentieth, if the refrigerating machines have substantially the same COP.

Hence, it is unnecessary to purchase a large number of large-sized refrigerating machines for cooling a cable. Further, heat exchangers are usually inexpensive in comparison to refrigerating machines. Furthermore, in an arrangement in which LNG is used as a cryogen 2 for the radiation shield 13 in FIG. 5, the heat exchanger 25 (a second heat exchanger) in FIG. 9 is not needed, as described above.

In the thus structured system, the superconducting power transmission pipeline can be used for transmission not only of electric power but also for transportation of LNG, and thus is capable of transporting a large amount of energy.

Moreover, various types of materials would be a candidate for a cryogen 2. In addition to LNG used in the above-mentioned example, rare gasses (Group 18 elements of the long periodic table) such as argon (regardless of whether gas or liquid state), helium, neon or the like and fluorocarbon-based material, for example, are usable. Further, air, nitrogen gas, hydrogen gas or the like would be usable. In general, a cryogen of this type needs less circulation power in a liquid state than in a gas state. However, the cryogen cannot necessarily be used in a liquid state at any given point in time, due to relation between an operating pressure and a boiling point thereof. Thus, as an example, gas-liquid mixed flow could be used. When, for example, pressure is increased, nitrogen and air are liquefied even under LNG temperature, as a result of which the pressure resistance of a pipe is increased, whereas circulation power can be reduced. The material and the structure may be selected based on other technical reasons.

It is noted that in a case where a cryogen for cooling a superconducting cable is different from a cryogen flowing through a radiation shield pipe 15 and these cryogens are not used at a site where electric power is received, the cryogens need to be circulated. In this case, return pipes for circulating respective cryogens are introduced inside of an outer pipe. Also, two similar systems may be made. How the system is constructed is determined according to a status of a consumer of the electric power.

Furthermore, a refrigerating machine is an apparatus (a heat pump) which uses electric power to transport heat flux from a low temperature side to a high temperature side, and thus has a heat exchanger on each of a high temperature side and a low temperature side. One of the heat exchangers preparing a cryogen of 77K is arranged in a 77K system and the other at a 300K system (on a normal temperature side). By cooling this heat exchanger on the normal temperature side by means of LNG or natural gas of low temperature, a difference in temperature between on the high temperature side and the low temperature side of the refrigerating machine becomes small, resulting in improvement in Carnot efficiency of the refrigerating system. In addition, the system can be designed to reduce the number of compressors and compression ratio thereof. Therefore, LNG cold energy is used also in a refrigerating machine to allow great improvement in economical performance. It is assumed that use of LNG cold energy for a refrigerating machine of 77K system for cooling a high-temperature superconducting cable results in improvement in COP by about two to three times at a rough estimate.

A boiling point of liquid nitrogen at one atmospheric pressure is 77K, and a boiling point of methane at one atmospheric pressure is 113K.

This temperature difference is not so large. However, in a current technological implementation, refrigerating machines used vary greatly according to this temperature difference. So, a refrigerating machine for LNG has a large COP and thus can be scaled up to make an extra large-sized one. Cold energy used for shielding a cable used for superconducting power transmission and distribution is extremely small in comparison to a capacity of an extra large-sized refrigerating machine used for LNG production. Hence, not only LNG-importing countries but also LNG-producing countries can easily use a cryogen such as LNG for superconducting power transmission and distribution. This is a system that can, for example, minimize an expensive refrigerating machine that provides a low temperature for keeping a state of superconductivity.

In the above embodiments, two concepts of use of LNG cold energy have been described. One is of a use for a radiation shield and the other is of a use for a refrigerating machine. These uses are expected to provide remarkably large economical merits, as described above.

Therefore, newly adding a radiation shield to a thermally insulated double pipe would pay off economically. Japan is a major LNG importer, and thus by using this technology, an application of high-temperature superconductivity would very soon be put into practical use.

In the above embodiments, the system using high-temperature superconductor and operated at a liquid nitrogen temperature has been described. In a system operated at a temperature of 20K to 30K as is the case of magnesium diboride ($MgB_2$), for example, uses helium gas or liquid hydrogen as a cryogen (for example, a first cryogen). As a result, a radiation shield 13 is of LNG temperature, and the temperature of an inner pipe 12 housing a superconducting cable 11 is 30K or lower. However, because of, as illustrated in FIG. 4, amounts of heat intrusion into the inner pipe in both cases being substantially the same, also a system using $MgB_2$ can achieve particularly remarkable effects by using LNG cold energy.

The disclosures of the aforementioned Patent Literature and Non-Patent Literatures are incorporated herein by reference thereto. The exemplary embodiments or examples may be modified or adjusted within the scope of the entire disclosure of the present invention, inclusive of the claims, based on the fundamental technical concept of the invention. Further, various combinations or selections of the elements disclosed herein (including any element of each claim, any element of each example, any element of each drawing or the like) may be made within the ambit of the claims of the present application. That is, the present invention may enclose various modifications or corrections that may be done by those skilled in the art based on the entire disclosure of the present application, inclusive of claims, and the technical concept of the present invention, of course. In particular, any numerical range disclosed herein should be interpreted that any intermediate values or sub-ranges falling within the disclosed range are also concretely disclosed even without specific recital thereof.

What is claimed is:

1. A superconducting power transmission system comprising:
   a first pipe housing a superconducting cable therein,
   a radiation shield covering at least a part of the first pipe from outside; and
   a second pipe housing the first pipe and the radiation shield therein, with a vacuum being created in a space from an inside of the second pipe to an outside of the first pipe with the radiation shield placed therebetween,
   the system further comprising
   at least one radiation shield pipe housed in the second pipe and thermally coupled with the radiation shield,
   a liquefied natural gas (LNG) as a second cryogen for the radiation shield being made to flow through the radiation shield pipe.

2. A superconducting power transmission system comprising:

a first pipe housing a superconducting cable therein,
a radiation shield covering at least a part of the first pipe from outside; and
a second pipe housing the first pipe and the radiation shield therein, with a vacuum being created in a space from an inside of the second pipe to an outside of the first pipe with the radiation shield placed therebetween, the system further comprising
at least one radiation shield pipe housed in the second pipe and thermally coupled with the radiation shield,
a cryogen heat-exchanged with a liquefied natural gas (LNG) as a second cryogen for the radiation shield being made to flow through the radiation shield pipe.

3. The superconducting power transmission system according to claim 2, wherein the second cryogen for the radiation shield is heat-exchanged with the LNG and cooled by a second heat exchanger, the cooled second cryogen being provided to the radiation shield pipe to flow therethrough,
an output of the second heat exchanger being heat-exchanged with seawater by a first heat exchanger to supply a natural gas, the first heat exchanger being arranged in a stage after the second heat exchanger.

4. The superconducting power transmission system according to claim 2, further comprising
a supporting member supporting mechanically the first pipe from the radiation shield and supporting mechanically the radiation shield in regard to the second pipe.

5. The superconducting power transmission system according to claim 2, wherein as the second cryogen at least one of the following is made to flow:
a rare gas including at least one selected from elements including at least argon, helium and neon;
a fluorocarbon-based material;
nitrogen or air regardless of whether in a gas or liquid state; and
a hydrogen gas.

6. The superconducting power transmission system according to claim 2, wherein the radiation shield pipe is thermally and mechanically connected to the radiation shield by at least a portion of an outside of the radiation shield pipe.

7. The superconducting power transmission system according to claim 2, wherein
a first cryogen for the superconducting cable is made to flow through the first pipe, wherein
the system further comprises
a return pipe circulating at least one of the first cryogen and the second cryogen.

8. The superconducting power transmission system according to claim 7, wherein cold energy of the liquefied natural gas is used in a high temperature-sided heat exchanger of a refrigerating machine to cool at least one of the first cryogen and the second cryogen.

9. A method of cooling a superconducting power transmission system that comprises:
a first pipe housing a superconducting cable therein;
a radiation shield covering at least a part of the first pipe from outside; and
a second pipe housing the first pipe and the radiation shield therein, with a vacuum being created in a space from an inside of the second pipe to an outside of the first pipe with the radiation shield placed therebetween, the method comprising:
arranging at least one radiation shield pipe thermally coupled with the radiation shield within the second pipe; and
causing a liquefied natural gas (LNG) as a second cryogen for the radiation shield to flow through the radiation shield pipe.

10. A method of cooling a superconducting power transmission system that comprises:
a first pipe housing a superconducting cable therein;
a radiation shield covering at least a part of the first pipe from outside; and
a second pipe housing the first pipe and the radiation shield therein, with a vacuum being created in a space from an inside of the second pipe to an outside of the first pipe with the radiation shield placed therebetween, the method comprising:
arranging at least one radiation shield pipe thermally coupled with the radiation shield within the second pipe; and
causing a cryogen heat-exchanged with a liquefied natural gas (LNG) as a second cryogen for the radiation shield to flow through the radiation shield pipe.

11. The method according to claim 10, comprising:
performing heat-exchange of the second cryogen for the radiation shield with the LNG to cool the second cryogen by a second heat exchanger, the cooled second cryogen being provided to the radiation shield pipe to flow therethrough,
an output of the second heat exchanger being heat-exchanged with seawater by a first heat exchanger to supply a natural gas, the first heat exchanger being arranged in a stage after the second heat exchanger.

12. The method according to claim 10, comprising:
supporting, by a supporting member, mechanically the first pipe from the radiation shield; and
supporting, by the supporting member, mechanically the radiation shield in regard to the second pipe.

13. The method according to claim 10, wherein as the second cryogen at least one of the following is made to flow:
a rare gas including at least one selected from elements including at least argon, helium and neon;
a fluorocarbon-based material;
nitrogen or air regardless of whether gas or liquid state; and
a hydrogen gas.

14. The method according to claim 10, wherein the radiation shield pipe is thermally and mechanically connected to the radiation shield by at least a portion of an outside of the radiation shield pipe.

15. The method according to claim 10, comprising:
causing a first cryogen for the superconducting cable to flow through the first pipe; and
causing at least one of the first cryogen and the second cryogen to being circulated using a return pipe.

16. The method according to claim 15, comprising
using cold energy of a liquefied natural gas in a high temperature-sided heat exchanger of a refrigerating machine to cool at least one of the first cryogen and the second cryogen.

* * * * *